(12) United States Patent
Liu

(10) Patent No.: US 9,019,421 B2
(45) Date of Patent: Apr. 28, 2015

(54) METHOD OF MANUFACTURING A MINIATURIZATION IMAGE CAPTURING MODULE

(71) Applicants: Lite-On Electronics (Guangzhou) Limited, Guangzhou (CN); Lite-On Technology Corporation, Taipei (TW)

(72) Inventor: Ti-Lun Liu, Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 14/159,681

(22) Filed: Jan. 21, 2014

(65) Prior Publication Data

US 2014/0130970 A1 May 15, 2014

Related U.S. Application Data

(63) Continuation of application No. 13/195,901, filed on Aug. 2, 2011, now Pat. No. 8,760,559.

(51) Int. Cl.
- *H04N 5/225* (2006.01)
- *B29C 65/50* (2006.01)
- *H01L 27/146* (2006.01)
- *H01L 21/00* (2006.01)

(52) U.S. Cl.
CPC ...... *B29C 65/5057* (2013.01); *H01L 27/14618* (2013.01); *H01L 27/14625* (2013.01)

(58) Field of Classification Search
CPC .................................................. H04N 5/2254

USPC ....................................... 348/340; 438/64, 68
See application file for complete search history.

(56) References Cited

U.S. PATENT DOCUMENTS

| | | | |
|---|---|---|---|
| 2004/0075761 A1* | 4/2004 | Maeda et al. ................. | 348/340 |
| 2005/0146632 A1* | 7/2005 | Wataya ......................... | 348/340 |
| 2008/0231693 A1* | 9/2008 | Takayama ...................... | 348/65 |
| 2008/0265350 A1* | 10/2008 | Wu et al. ....................... | 257/432 |
| 2009/0153706 A1* | 6/2009 | Webster et al. ............... | 348/294 |
| 2009/0262226 A1* | 10/2009 | Lee et al. ...................... | 348/294 |
| 2009/0283662 A1* | 11/2009 | Wu et al. ....................... | 250/206 |
| 2009/0284628 A1* | 11/2009 | Wu et al. ....................... | 348/294 |
| 2010/0309353 A1* | 12/2010 | Hagiwara ..................... | 348/294 |
| 2011/0043686 A1* | 2/2011 | Chang .......................... | 348/374 |
| 2011/0157452 A1* | 6/2011 | Goh et al. ..................... | 348/340 |

* cited by examiner

*Primary Examiner* — Kelly L Jerabek
(74) *Attorney, Agent, or Firm* — Li & Cai Intellectual Property (USA) Office

(57) ABSTRACT

A method of manufacturing a miniaturization image capturing module includes adhesively placing a double side adhesive element onto a carrier board; adhesively placing an image capturing chip onto the double side adhesive element; adhesively placing a substrate unit onto the double side adhesive element, the substrate unit including a hollow substrate body adhered to the double side adhesive element and surrounding the image capturing chip; forming a fixing glue between the hollow substrate body and the image capturing chip to fix the position of the image capturing chip relative to the hollow substrate body; electrically connecting the image capturing chip to the substrate unit; positioning a lens unit on the top side of the hollow substrate body, the lens unit including a lens group disposed above the image capturing chip; and then removing the carrier board to expose the double side adhesive element.

5 Claims, 10 Drawing Sheets

METHOD OF MANUFACTURING A MINIATURIZATION IMAGE CAPTURING MODULE

CROSS REFERENCE TO RELATED APPLICATION

This application is a continuation application of U.S. application Ser. No. 13/195,901, filed on Aug. 2, 2011, and entitled "MINIATURIZATION IMAGE CAPTURING MODULE AND METHOD OF MANUFACTURING THE SAME", the entire contents of which are hereby incorporated by reference.

BACKGROUND OF THE INVENTION

1. Field of the Invention

The instant disclosure relates to a method of manufacturing an image capturing module, and more particularly, to a method of manufacturing a miniaturization image capturing module.

2. Description of Related Art

With a rapid progress in multimedia, digital images are extensively applied, and therefore demands for image processing devices are increasing. Currently, various digital image products including web cameras, digital cameras, optical scanners, and image phones employ image sensors for retrieving images. The image sensor includes a CCD image sensor chip and a CMOS image sensor chip that are capable of receiving light emitted by scene and transmitting the light into digital signals. The image sensor chips require light sources for receiving, and accordingly a package method of these image sensor chips is different from a package method of normal electronic products.

The conventional package technology applied to the image sensor chips mostly includes a plastic leadless chip carrier (PLCC) technology or a ceramic leadless chip carrier (CLCC) technology. For instance, the conventional image sensor chip package structure formed by applying the CLCC technology includes a ceramic base, an image sensor chip, and a glass cover plate. The image sensor chip is disposed on the ceramic base and electrically connected with the ceramic base by wire bonding. In addition, the glass cover plate is assembled to the ceramic base, and the glass cover plate and the ceramic base together form a sealed space for accommodating the image sensor chip, such that the image sensor chip and wires are protected. On the other hand, light is able to be transmitted to the image sensor chip through the glass cover plate.

However, the thickness of the conventional image sensor chip package structure is still too large and needed to be reduced.

SUMMARY OF THE INVENTION

One aspect of the instant disclosure relates to a method of manufacturing a miniaturization image capturing module that can be applied to an electronic product having a miniaturization space.

One of the embodiments of the instant disclosure provides a method of manufacturing a miniaturization image capturing module, comprising the steps of: adhesively placing at least one double side adhesive element onto a carrier board; adhesively placing at least one image capturing chip onto the at least one double side adhesive element; adhesively placing a substrate unit onto the at least one double side adhesive element, wherein the substrate unit includes a hollow substrate body adhered to the at least one double side adhesive element and surrounding the at least one image capturing chip; forming a fixing glue between the hollow substrate body and the at least one image capturing chip to fix the position of the at least one image capturing chip relative to the hollow substrate body; electrically connecting the at least one image capturing chip to the substrate unit; positioning a lens unit on the top side of the hollow substrate body, wherein the lens unit includes a lens group disposed above the at least one image capturing chip and corresponding to the at least one image capturing chip; and then removing the carrier board to expose the at least one double side adhesive element.

Furthermore, after the step of removing the carrier board to expose the at least one double side adhesive element, the method further comprises: placing the substrate unit on a main circuit board. In addition, after the step of removing the carrier board to expose the at least one double side adhesive element, the method further comprises: removing the double side adhesive element to simultaneously expose the bottom surface of the hollow substrate body, the bottom surface of the at least one image capturing chip, and the bottom surface of the fixing glue, and then placing the substrate unit on a main circuit board.

Therefore, because the at least one image capturing chip can be received in the at least one receiving space and electrically connected to the substrate unit, and the fixing glue can be disposed in the at least one receiving space and fixed between the hollow substrate body and the at least one image capturing chip to fix the position of the image capturing chip relative to the hollow substrate body, the thickness of the image capturing module of the instant disclosure can be miniaturized. Hence, the miniaturization image capturing module of the instant disclosure can be applied to an electronic product having a miniaturization space.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
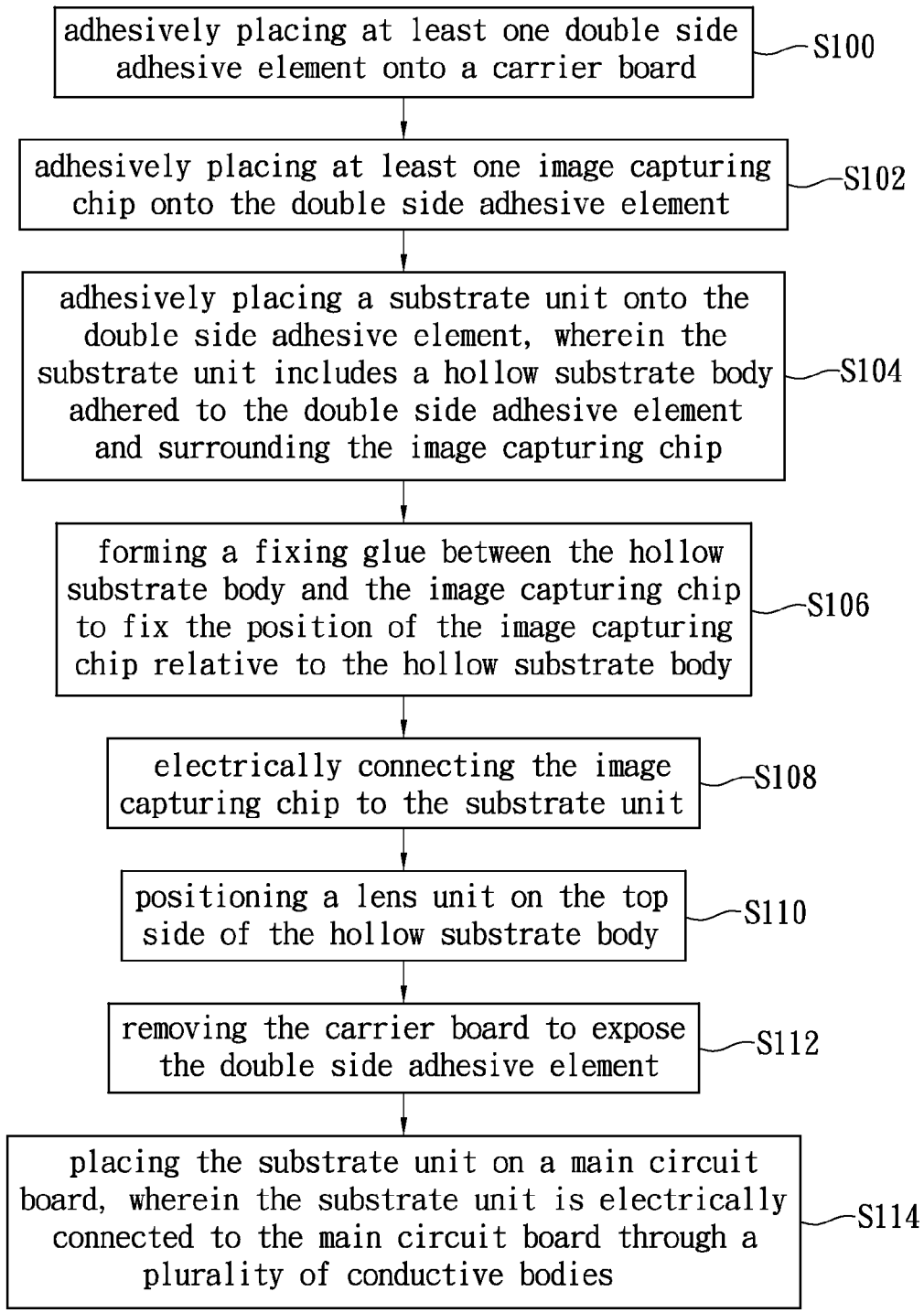
FIG. 1 shows a flowchart of a method of manufacturing a miniaturization image capturing module according to the first embodiment of the instant disclosure.
Figure 2A:
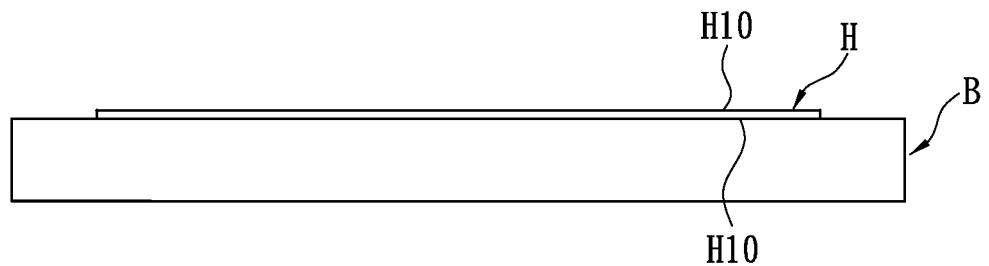
FIG. 2A shows a lateral, cross-sectional, schematic view of the step S100 according to the first embodiment of the instant disclosure.

Referring to FIGS. 1, 2A to 2H, and 3A to 3C, where the first embodiment of the instant discloses a method of manufacturing a miniaturization image capturing module, at least comprising the steps of:

The step S100 is that: referring to FIGS. 1 and 2A, adhesively placing at least one double side adhesive element H onto a carrier board B in order to position the double side adhesive element H. Moreover, the double side adhesive element H has two opposite adhesive surfaces H10, and the double side adhesive element H is adhered to the carrier board B through one of the two adhesive surfaces H10. For example, the double side adhesive element H may be a double side adhesive tape, and the maximum heat resistant temperature of the double side adhesive element H may be between about 190☐ and about 210☐. However, the double side adhesive element H used in the first embodiment is merely an example and is not meant to limit the instant disclosure.

Figure 2B:
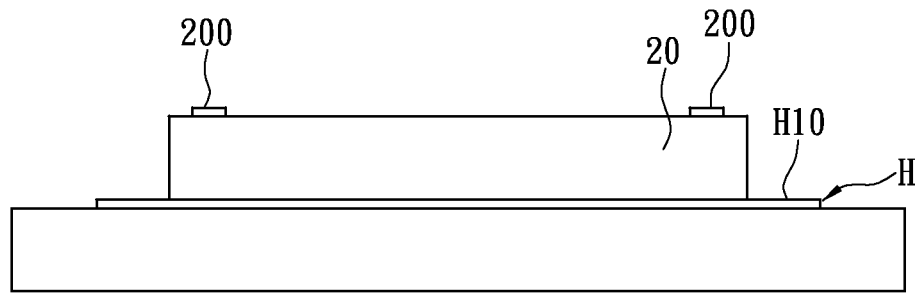
FIG. 2B shows a lateral, cross-sectional, schematic view of the step S102 according to the first embodiment of the instant disclosure.

The step S102 is that: referring to FIGS. 1 and 2B, adhesively placing at least one image capturing chip 20 onto the double side adhesive element H in order to position the at least one image capturing chip 20. That means the at least one image capturing chip 20 is adhered to the other adhesive surface H10 of the double side adhesive element H in order to position the at least one image capturing chip 20. In addition, the at least one image capturing chip 20 has a plurality of electrical conductive pads 200 formed on the top side thereof. For example, the at least one image capturing chip 20 may be an image sensing chip for capturing images.

Figure 2C:
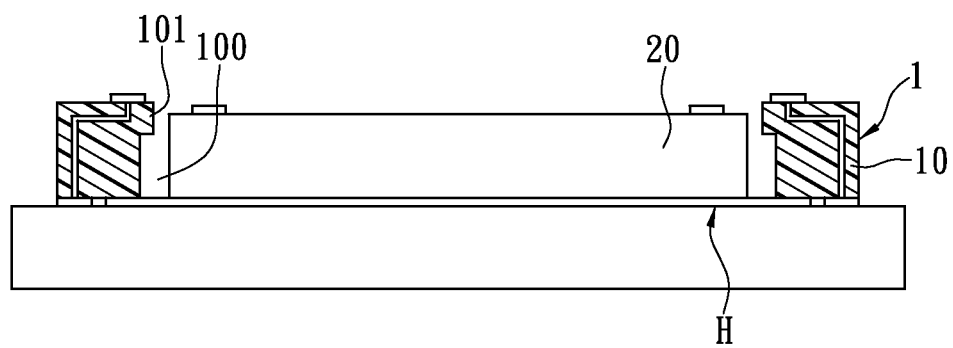
FIG. 2C shows a lateral, cross-sectional, schematic view of the step S104 according to the first embodiment of the instant disclosure.

The step S104 is that: referring to FIGS. 1 and 2C, adhesively placing a substrate unit 1 onto the double side adhesive element H, wherein the substrate unit 1 includes a hollow substrate body 10 adhered to the double side adhesive element H and surrounding the at least one image capturing chip 20. The hollow substrate body 10 has at least one receiving space 100 for receiving the at least one image capturing chip 20, and the receiving space 100 penetrates through the hollow substrate body 10. Moreover, referring to FIGS. 2C and 3A to 3C, the substrate unit 1 further includes a plurality of top conductive pads 11 disposed on the top side of the hollow substrate body 10, a plurality of bottom conductive pads 12 disposed on the bottom side of the hollow substrate body 10, a plurality of embedded conductive traces 13 embedded inside the hollow substrate body 10, and each embedded conductive trace 13 is electrically connected between at least one of the top conductive pads 11 and at least one of the bottom conductive pads 12. For example, the substrate unit 1 may be a ceramic substrate, a BT (Bismaleimide Triazine) substrate, or any other circuit substrate. However, the substrate unit 1 used in the first embodiment is merely an example and is not meant to limit the instant disclosure.

Figure 2D:
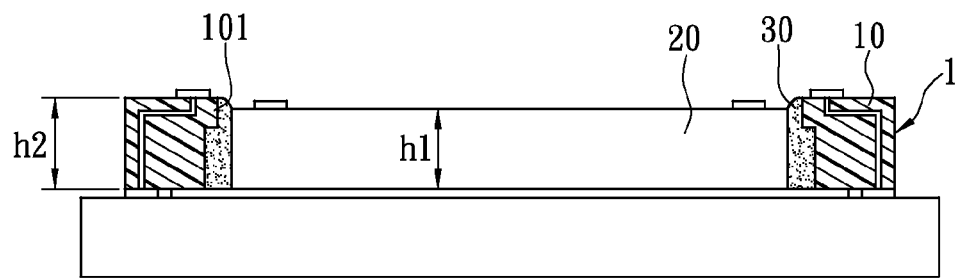
FIG. 2D shows a lateral, cross-sectional, schematic view of the step S106 according to the first embodiment of the instant disclosure.

The step S106 is that: referring to FIGS. 1, 2C, and 2D, forming a fixing glue 30 between the hollow substrate body 10 and the at least one image capturing chip 20 to fix the position of the at least one image capturing chip 20 relative to the hollow substrate body 10. In other words, the fixing glue 30 may be an annular fixing glue firmly received inside the receiving space 100 and fixed between the hollow substrate body 10 and the at least one image capturing chip 20, thus the fixing glue 30 can surround and tightly adhere to the at least one image capturing chip 20. In addition, the hollow substrate body 10 may be an annular substrate body, thus the hollow substrate body 10 can surround and tightly adhere to the fixing glue 30. For example, liquid glue (not shown) can be filled between the hollow substrate body 10 and the at least one image capturing chip 20, and then the liquid glue can be solidified to form the fixing glue 30 received inside the receiving space 100 and fixed between the hollow substrate body 10 and the at least one image capturing chip 20. In addition, the fixing glue 30 can be formed by any adhesive materials such as ABLEBOND 2035SC, LOCTITE 3128, or LOCTITE 2204 . . . etc. However, the fixing glue 30 used in the first embodiment is merely an example and is not meant to limit the instant disclosure.

Figure 3A:
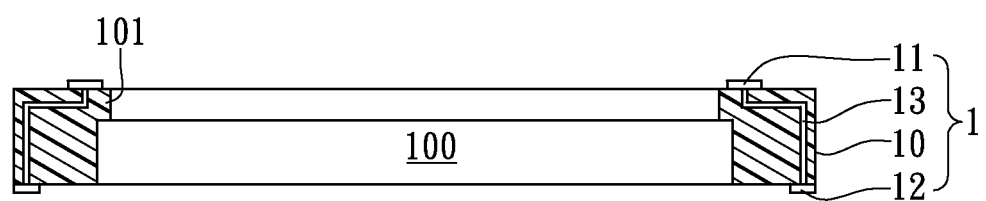
FIG. 3A shows a lateral, cross-sectional, schematic view of the substrate unit according to the first embodiment of the instant disclosure.
Figure 3B:
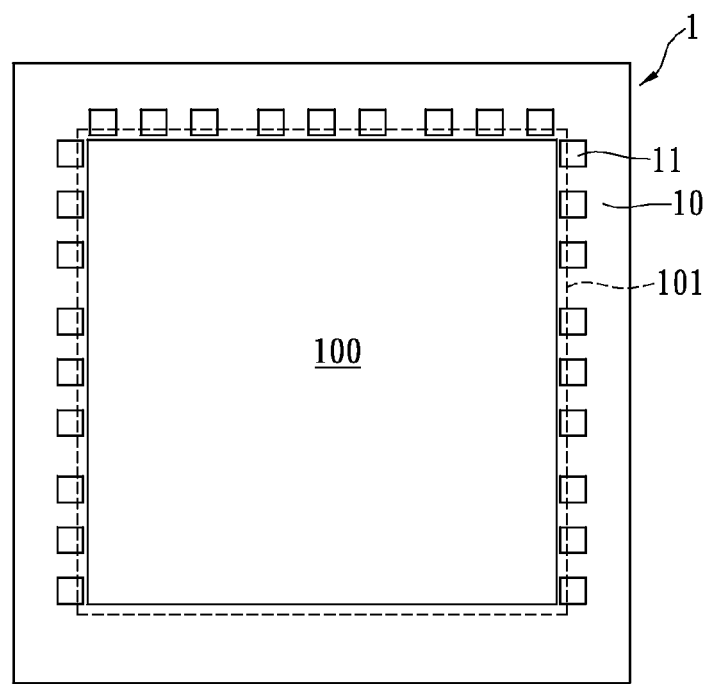
FIG. 3B shows a top, schematic view of the substrate unit according to the first embodiment of the instant disclosure.
Figure 3C:
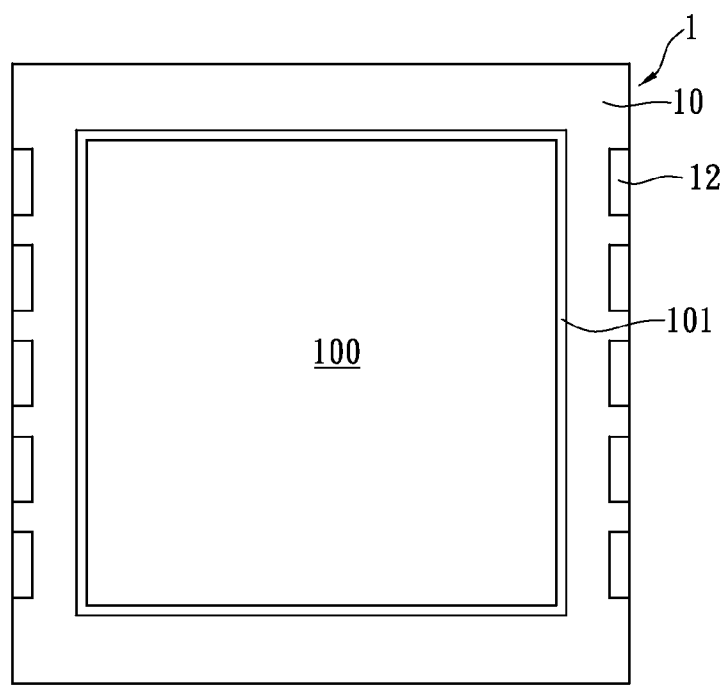
FIG. 3C shows a bottom, schematic view of the substrate unit according to the first embodiment of the instant disclosure.

Furthermore, referring to FIGS. 2D, 3A, and 3C, the hollow substrate body 10 has at least one annular protrusion portion 101 projected from the inner surface thereof and disposed in the receiving space 100, and the annular protrusion portion 101 can be covered by the fixing glue 30. The contact area between the fixing glue 30 and the inner surface of the hollow substrate body 10 can be increased by using the annular protrusion portion 101, thus the fixing glue 30 can be firmly adhered to the inner surface of the hollow substrate body 10 and firmly fixed between the hollow substrate body 10 and the at least one image capturing chip 20. Of course, the single annular protrusion portion 101 can be replaced by a plurality of micro protrusion portions (not shown) disposed on the inner surface of the hollow substrate body and separated from each other by a predetermined distance. In other words, the position of the at least one image capturing chip 20 relative to the hollow substrate body 10 can be firmly positioned by using the single annular protrusion portion 101 or the micro protrusion portions (not shown). In addition, the bottom surface of the hollow substrate body 10, the bottom surface of the at least one image capturing chip 20, and the bottom surface of the fixing glue 30 are substantially flushed with each other, and the at least one image capturing chip 20 has a thickness h1 less than a thickness h2 of the hollow substrate body 10, thus the at least one image capturing chip 20 can be completely received inside the receiving space 100.

Figure 2E:
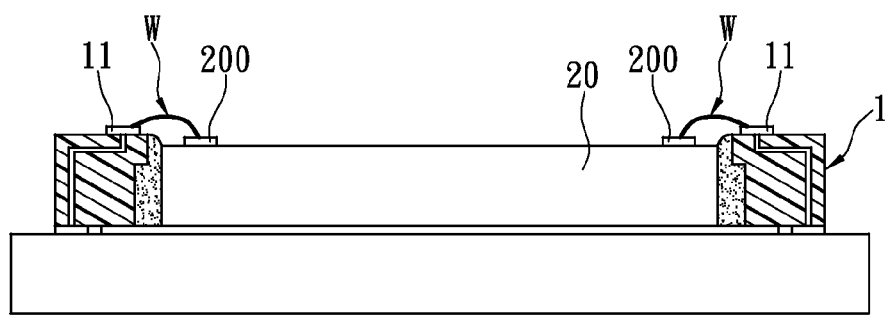
FIG. 2E shows a lateral, cross-sectional, schematic view of the step S108 according to the first embodiment of the instant disclosure.

The step S108 is that: referring to FIGS. 1 and 2E, electrically connecting the at least one image capturing chip 20 to the substrate unit 1. For example, the at least one image capturing chip 20 has a plurality of electrical conductive pads 200 formed on the top side thereof, and each electrical conductive pad 200 of the at least one image capturing chip 20 can be electrically connected to each corresponding top conductive pad 11 of the substrate unit 1 through a corresponding conductive wire W, thus the at least one image capturing chip 20 can be electrically connected with the substrate unit 1 by wire bonding.

Figure 2F:
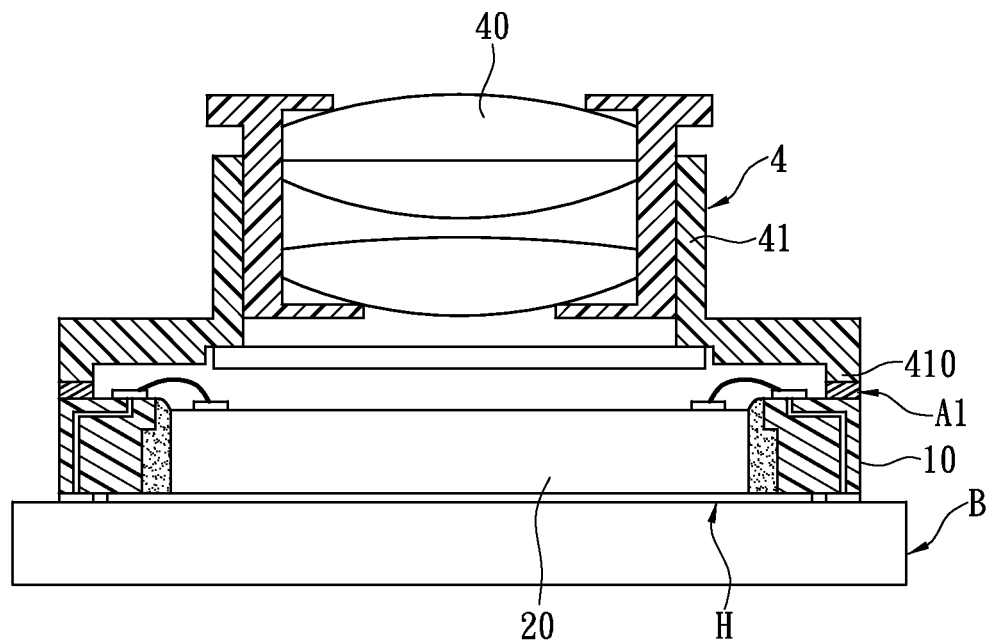
FIG. 2F shows a lateral, cross-sectional, schematic view of the step S110 according to the first embodiment of the instant disclosure.

The step S110 is that: referring to FIGS. 1 and 2F, positioning a lens unit 4 on the top side of the hollow substrate body 10. The lens unit 4 includes a lens group 40 disposed above the at least one image capturing chip 20 and corresponding to the at least one image capturing chip 20, and the lens group 40 can be composed of a plurality of lens. For example, the lens unit 4 includes an external casing 41, the external casing 41 has an annular fixing frame 410 formed on the bottom side thereof, and the annular fixing frame 410 is positioned on the top side of the hollow substrate body 10 through an annular adhesive glue A1. In addition, the annular adhesive glue A1 may be LOCTITE 3128 or LOCTITE 2204 . . . etc. However, the annular adhesive glue A1 used in the first embodiment is merely an example and is not meant to limit the instant disclosure.

Figure 2G:
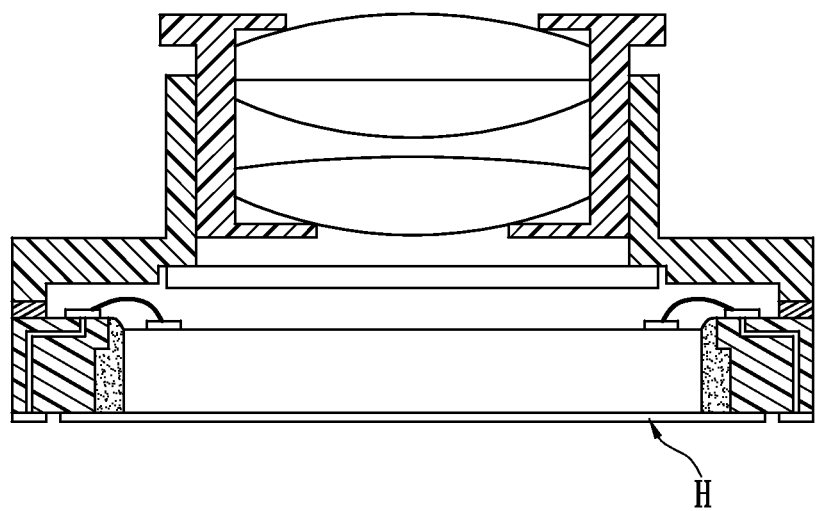
FIG. 2G shows a lateral, cross-sectional, schematic view of the step S112 according to the first embodiment of the instant disclosure.

The step S112 is that: referring to FIGS. 1, 2F, and 2G, removing the carrier board B to expose the double side adhesive element H.

Figure 2H:
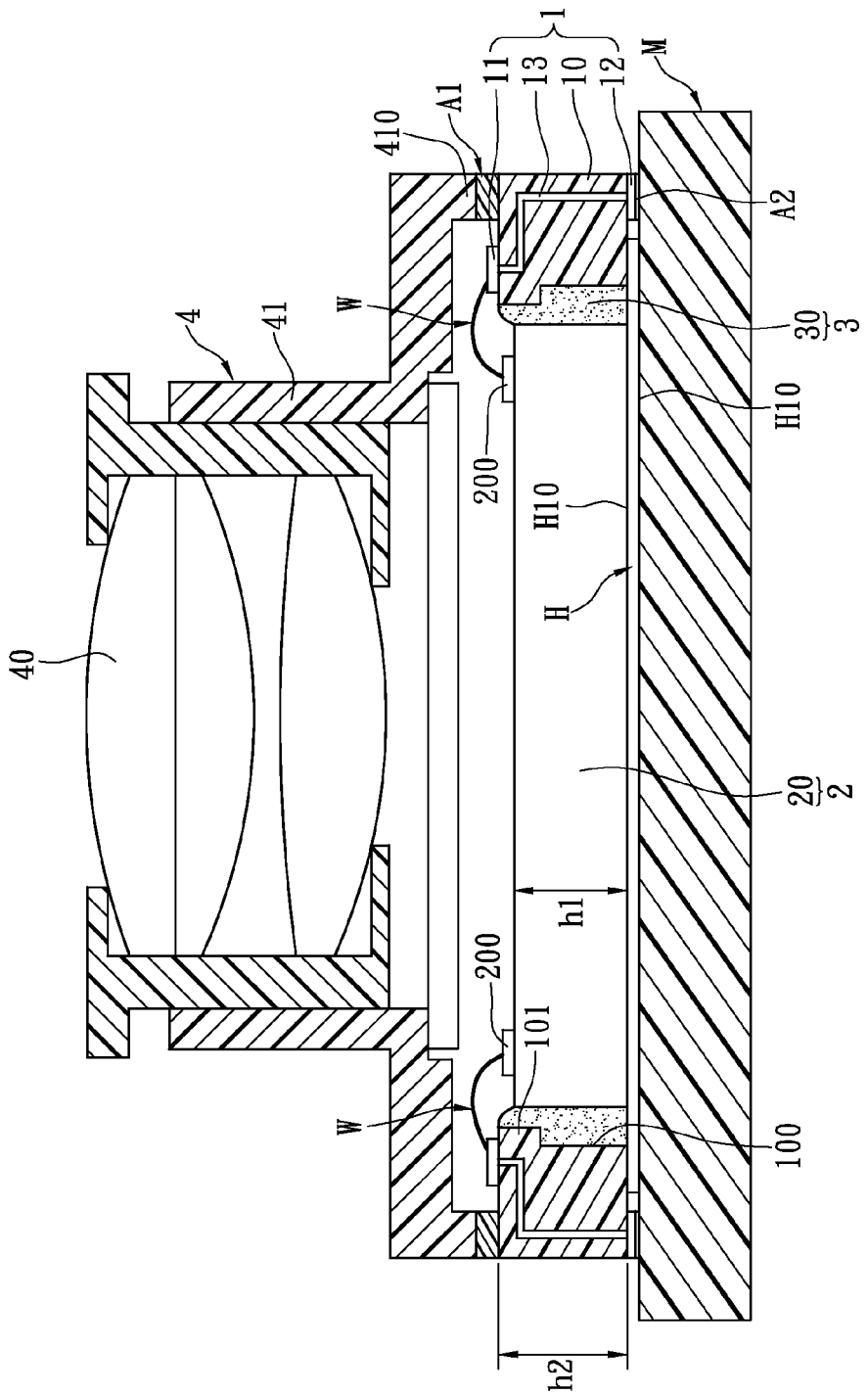
FIG. 2H shows a lateral, cross-sectional, schematic view of the step S114 according to the first embodiment of the instant disclosure.

The step S114 is that: referring to FIGS. 1 and 2H, placing the substrate unit 1 on a main circuit board M, wherein the substrate unit 1 is electrically connected to the main circuit board M through a plurality of conductive bodies A2, and each bottom conductive pad 12 of the substrate unit 1 is electrically connected to the main circuit board M through the corresponding conductive body A2. In addition, one of the two adhesive surfaces H10 of the double side adhesive element H is adhered to the bottom surface of the hollow substrate body 10, the bottom surface of the at least one image capturing chip 20, and the bottom surface of the fixing glue 30, and the other adhesive surface H10 of the double side adhesive element H is adhered to the main circuit board M. Of course, the conductive bodies A2 can be replaced by an anisotropic conductive film (ACF). In other words, the bottom conductive pads 12 of the substrate unit 1 can be electrically connected to the different conductive areas (not shown) of the main circuit board M through the anisotropic conductive film.

Referring to FIG. 2H again, the first embodiment of the instant disclose provides a miniaturization image capturing module manufactured from the step S100 to the step S114. The miniaturization image capturing module comprises a substrate unit 1, an image capturing unit 2, a fixing glue unit 3, and a lens unit 4.

The substrate unit 1 includes a hollow substrate body 10, a plurality of top conductive pads 11 disposed on the top side of the hollow substrate body 10, a plurality of bottom conductive pads 12 disposed on the bottom side of the hollow substrate body 10, a plurality of embedded conductive traces 13 embedded inside the hollow substrate body 10. In addition, the hollow substrate body 10 has at least one receiving space 100, and each embedded conductive trace 13 is electrically connected between at least one of the top conductive pads 11 and at least one of the bottom conductive pads 12. For example, the hollow substrate body 10 has at least one annular protrusion portion 101 projected from the inner surface thereof and disposed in the receiving space 100, and the receiving space 100 passes through the hollow substrate body 10.

Moreover, the image capturing unit 2 includes at least one image capturing chip 20 received in the receiving space 100 and electrically connected to the substrate unit 1. For example, the at least one image capturing chip 20 has a plurality of electrical conductive pads 200 formed on the top side thereof, and each electrical conductive pad 200 of the at least one image capturing chip 20 can be electrically connected to each corresponding top conductive pad 11 of the substrate unit 1 through a corresponding conductive wire W, thus the at least one image capturing chip 20 can be electrically connected with the substrate unit 1 by wire bonding.

In addition, the fixing glue unit 3 includes a fixing glue 30 disposed in the receiving space 100 and fixed between the hollow substrate body 10 and the at least one image capturing chip 20. For example, the fixing glue 30 may be an annular fixing glue firmly received inside the receiving space 100 and fixed between the hollow substrate body 10 and the at least one image capturing chip 20, thus the fixing glue 30 can surround and tightly adhere to the at least one image capturing chip 20. In addition, the hollow substrate body 10 may be an annular substrate body, thus the hollow substrate body 10 can surround and tightly adhere to the fixing glue 30. Moreover, the contact area between the fixing glue 30 and the inner surface of the hollow substrate body 10 can be increased by using the annular protrusion portion 101, thus the fixing glue 30 can be firmly adhered to the inner surface of the hollow substrate body 10 and firmly fixed between the hollow substrate body 10 and the at least one image capturing chip 20. Of course, the single annular protrusion portion 101 can be replaced by a plurality of micro protrusion portions (not shown) disposed on the inner surface of the hollow substrate body and separated from each other by a predetermined distance. In other words, the position of the at least one image capturing chip 20 relative to the hollow substrate body 10 can be firmly positioned by using the single annular protrusion portion 101 or the micro protrusion portions (not shown). In addition, the bottom surface of the hollow substrate body 10, the bottom surface of the at least one image capturing chip 20, and the bottom surface of the fixing glue 30 are substantially flushed with each other, and the at least one image capturing chip 20 has a thickness h1 less than a thickness h2 of the hollow substrate body 10, thus the at least one image capturing chip 20 can be completely received inside the receiving space 100.

Furthermore, the lens unit 4 is disposed on the top side of the hollow substrate body 10, and the lens unit 4 includes a lens group 40 disposed above the at least one image capturing chip 20 and corresponding to the at least one image capturing chip 20. For example, the lens unit 4 includes an external casing 41, the external casing 41 has an annular fixing frame 410 formed on the bottom side thereof, and the annular fixing frame 410 is positioned on the top side of the hollow substrate body 10 through an annular adhesive glue A1.

Moreover, the miniaturization image capturing module further comprises at least one double side adhesive element H having two opposite adhesive surfaces H10. One of the two adhesive surfaces H10 of the double side adhesive element H is simultaneously adhered to the bottom surface of the hollow substrate body 10, the bottom surface of the at least one image capturing chip 20, and the bottom surface of the fixing glue 30, and the other adhesive surface H10 of the double side adhesive element H is adhered to a main circuit board M. When the substrate unit 1 is disposed on the main circuit board M, each bottom conductive pad 12 of the substrate unit 1 can be electrically connected to the main circuit board M through a corresponding conductive body A2. Of course, the conductive bodies A2 can be replaced by an anisotropic conductive film (ACF). In other words, the bottom conductive pads 12 of the substrate unit 1 can be electrically connected to the different conductive areas (not shown) of the main circuit board M through the anisotropic conductive film.

Second Embodiment

Figure 4:
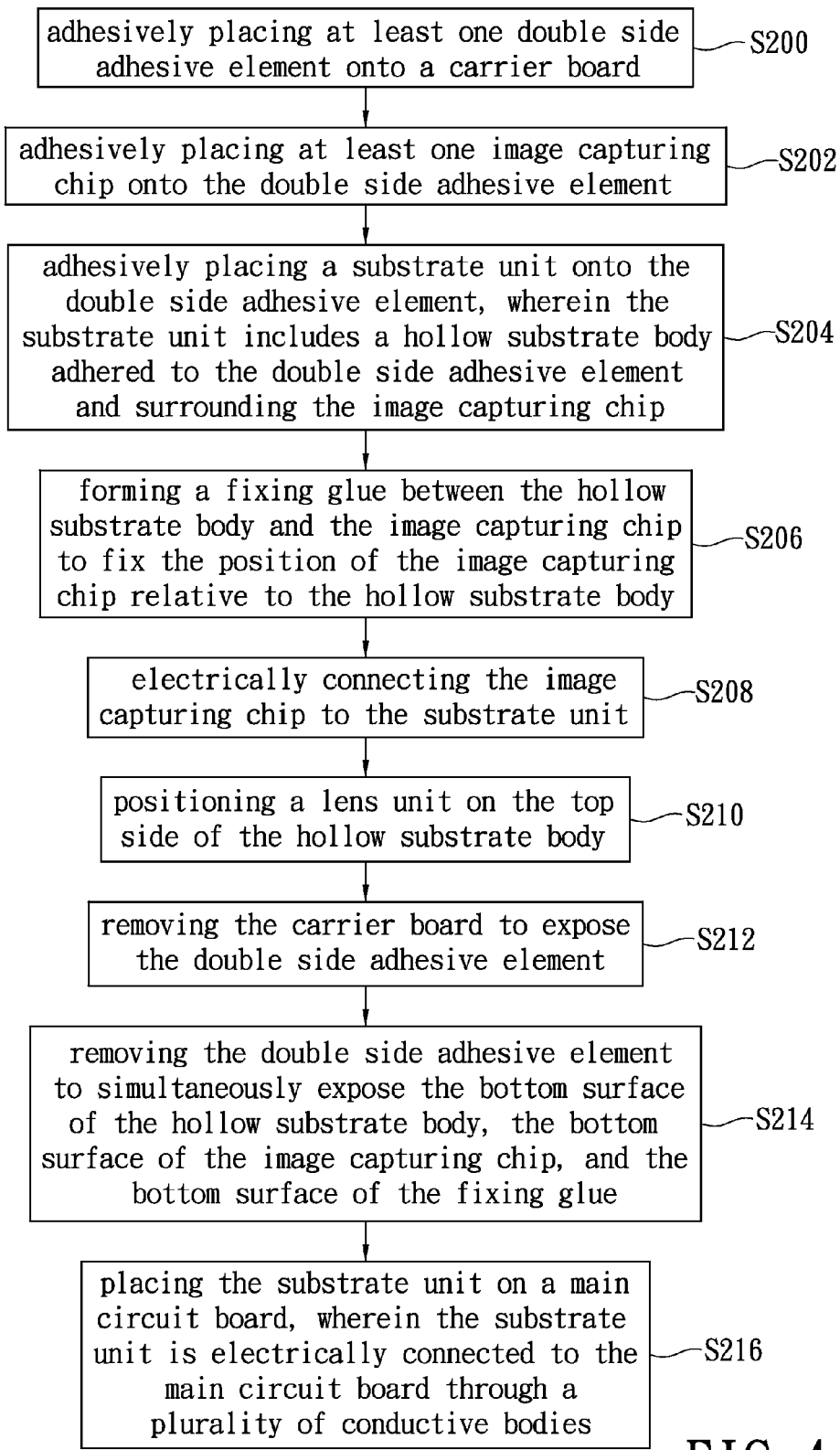
FIG. 4 shows a flowchart of a method of manufacturing a miniaturization image capturing module according to the second embodiment of the instant disclosure.
Figure 5A:
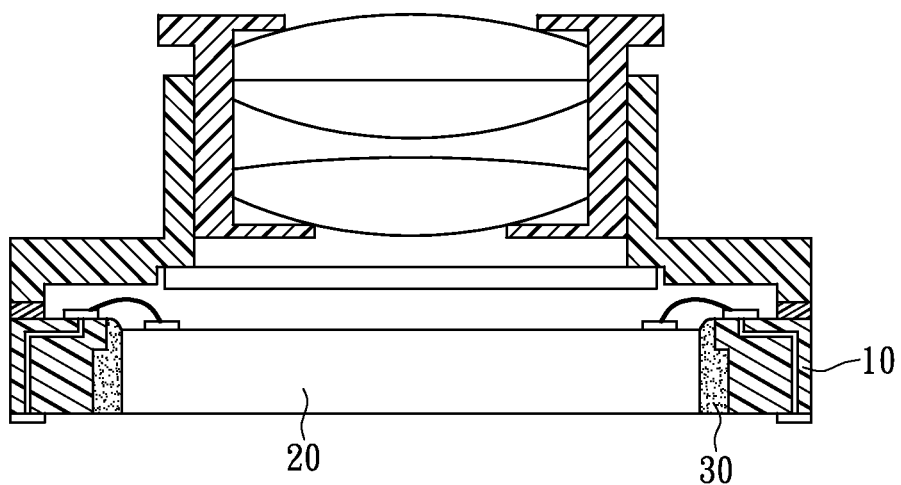
FIG. 5A shows a lateral, cross-sectional, schematic view of the step S214 according to the second embodiment of the instant disclosure.
Figure 5B:
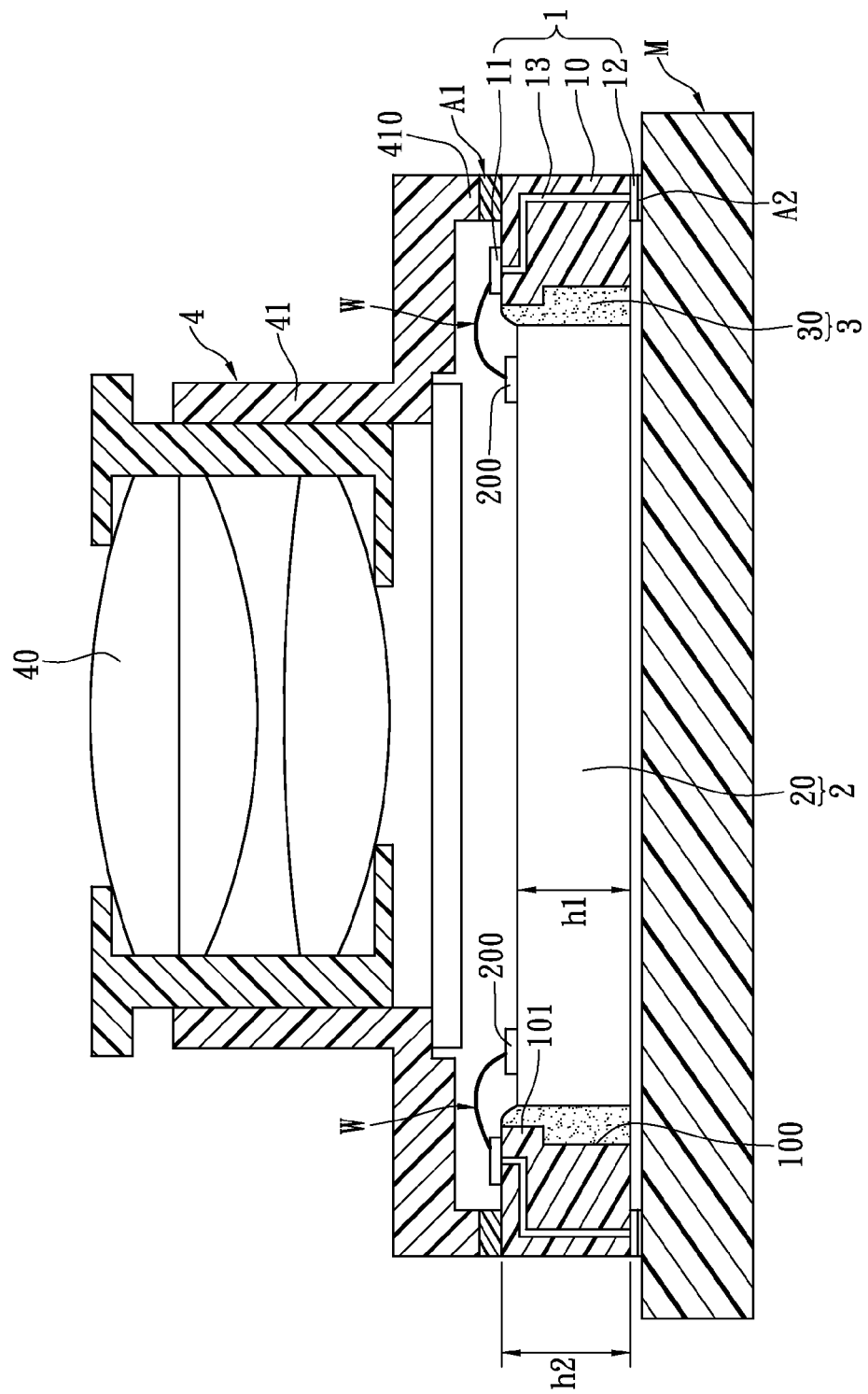
FIG. 5B shows a lateral, cross-sectional, schematic view of the step S216 according to the second embodiment of the instant disclosure.

Referring to FIGS. 4 and 5A to 5B, where the second embodiment of the instant discloses a method of manufacturing a miniaturization image capturing module. Comparing FIG. 4 with FIG. 1, the step S200 to the step S212 in the second embodiment are the same as the step S100 to the step S112 in the first embodiment. The difference between the second embodiment and the first embodiment is that: after the step S212 (as shown in FIG. 2G), the method of the second embodiment further comprises:

The step S214 is that: referring to FIGS. 4, 2G and 5A, removing the double side adhesive element H to simultaneously expose the bottom surface of the hollow substrate body 10, the bottom surface of the at least one image capturing chip 20, and the bottom surface of the fixing glue 30.

The step S216 is that: referring to FIGS. 4 and 5B, placing the substrate unit 1 on a main circuit board M, wherein the substrate unit 1 is electrically connected to the main circuit board M through a plurality of conductive bodies A2, and each bottom conductive pad 12 is electrically connected to the main circuit board M through the corresponding conductive body A2. Hence, comparing FIG. 5B with FIG. 2H, the second embodiment of the instant disclose can omit the double side adhesive element H from the miniaturization image capturing module.

In conclusion, because the at least one image capturing chip can be received in the at least one receiving space and electrically connected to the substrate unit and the fixing glue can be disposed in the at least one receiving space, and fixed between the hollow substrate body and the at least one image capturing chip to fix the position of the image capturing chip relative to the hollow substrate body, the thickness of the image capturing module of the instant disclosure can be miniaturized. Hence, the miniaturization image capturing module of the instant disclosure can be applied to an electronic product having a miniaturization space.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A method of manufacturing a miniaturization image capturing module, comprising the steps of:
    adhesively placing at least one double side adhesive element onto a carrier board;
    adhesively placing at least one image capturing chip onto the at least one double side adhesive element;
    adhesively placing a substrate unit onto the at least one double side adhesive element, wherein the substrate unit includes a hollow substrate body adhered to the at least one double side adhesive element and surrounding the at least one image capturing chip;
    forming a fixing glue between the hollow substrate body and the at least one image capturing chip to fix the position of the at least one image capturing chip relative to the hollow substrate body;
    electrically connecting the at least one image capturing chip to the substrate unit;
    positioning a lens unit on the top side of the hollow substrate body, wherein the lens unit includes a lens group disposed above the at least one image capturing chip and corresponding to the at least one image capturing chip; and
    removing the carrier board to expose the at least one double side adhesive element;
    wherein the hollow substrate body has at least one receiving space for receiving the at least one image capturing chip, the hollow substrate body has at least one annular protrusion portion projected from the inner surface thereof and disposed in the at least one receiving space, the at least one annular protrusion portion is covered by the fixing glue, and the at least one receiving space penetrates through the hollow substrate body.

2. The method of claim 1, wherein after the step of removing the carrier board to expose the at least one double side adhesive element, the method further comprises: placing the substrate unit on a main circuit board, wherein the at least one double side adhesive element having two opposite adhesive surfaces, one of the two adhesive surfaces of the at least one double side adhesive element adhered to the bottom surface of the hollow substrate body, the bottom surface of the at least one image capturing chip, and the bottom surface of the fixing glue, and the other adhesive surface of the at least one double side adhesive element is adhered to a main circuit board, wherein the substrate unit includes a plurality of bottom conductive pads disposed on the bottom side of the hollow substrate body, and each bottom conductive pad is electrically connected to the main circuit board through a corresponding conductive body.

3. The method of claim 1, wherein after the step of removing the carrier board to expose the at least one double side adhesive element, the method further comprises: removing the double side adhesive element to simultaneously expose the bottom surface of the hollow substrate body, the bottom surface of the at least one image capturing chip, and the bottom surface of the fixing glue.

4. The method of claim 3, wherein after the step of removing the double side adhesive element, the method further comprises: placing the substrate unit on a main circuit board, wherein the substrate unit includes a plurality of bottom conductive pads disposed on the bottom side of the hollow substrate body, and each bottom conductive pad is electrically connected to the main circuit board through a corresponding conductive body.

5. The method of claim 1, wherein the bottom surface of the hollow substrate body, the bottom surface of the at least one image capturing chip, and the bottom surface of the fixing glue are substantially flushed with each other, and the at least one image capturing chip has a thickness less than that of the hollow substrate body.

* * * * *